United States Patent [19]

Grabbe

[11] Patent Number: 5,637,919

[45] Date of Patent: Jun. 10, 1997

[54] PERIMETER INDEPENDENT PRECISION LOCATING MEMBER

[76] Inventor: Dimitry G. Grabbe, 2160 Rosedale Ave., Middletown, Pa. 17057

[21] Appl. No.: 568,097

[22] Filed: Dec. 6, 1995

Related U.S. Application Data

[63] Continuation-in-part of Ser. No. 98,656, Jul. 28, 1993, abandoned.

[51] Int. Cl.$^6$ ................................................. H01L 23/48
[52] U.S. Cl. ........................ 257/690; 257/730; 257/778; 257/797
[58] Field of Search ................................. 257/777, 778, 257/797, 690, 701, 730

[56] References Cited

U.S. PATENT DOCUMENTS

| 3,777,221 | 12/1973 | Tatusko et al. | 257/778 |
| 4,565,314 | 1/1986 | Scholz | 228/180 |
| 5,182,782 | 1/1993 | Tabasky et al. | 385/89 |
| 5,342,206 | 8/1994 | Grabbe et al. | 439/71 |
| 5,502,631 | 3/1996 | Adachi | 257/797 |
| 5,521,427 | 5/1996 | Chia | 257/797 |

FOREIGN PATENT DOCUMENTS

| 0 312 217 | 4/1989 | European Pat. Off. . |
| 0 439 134 A2 | 7/1991 | European Pat. Off. . |
| 2 320 633 | 3/1977 | France . |
| 59-158540 | 9/1984 | Japan | 257/797 |
| 1543263 | 7/1976 | United Kingdom . |

OTHER PUBLICATIONS

Patent Abstracts of Japan, vol. 7, No. 236 (E–205) (1381) Oct. 20, 1983.
European Search Report dated Oct. 18, 1994.

*Primary Examiner*—Sara W. Crane
*Assistant Examiner*—Roy Potter
*Attorney, Agent, or Firm*—Salvatore Anastasi; Bruce J. Wolstoncroft

[57] ABSTRACT

A perimeter independent precision locating member (22) for a semiconductor chip (10) so that contact sites upon the chip will be reliably positioned relative to connection members (18), such as contacts or leads, so that the chip may be electrically engageable. The locating member (22) is disposed upon the surface of the semiconductor chip (10) at a specific position relative to the contact sites within the perimeter (24) of the chip and being closely matable with a complementary portion of a housing that contains the connection members (18). The method of making the perimeter independent precision locating member (22) for a semiconductor chip (10) involves coating the chip with a layer of photocurable material, masking the material in relation to the contact sites so that the portion of the material that will become the locating member (22) is exposed, illuminating the exposed portion of the photocurable material, and stripping from the chip the uncured portion to define the locating member (22).

21 Claims, 5 Drawing Sheets

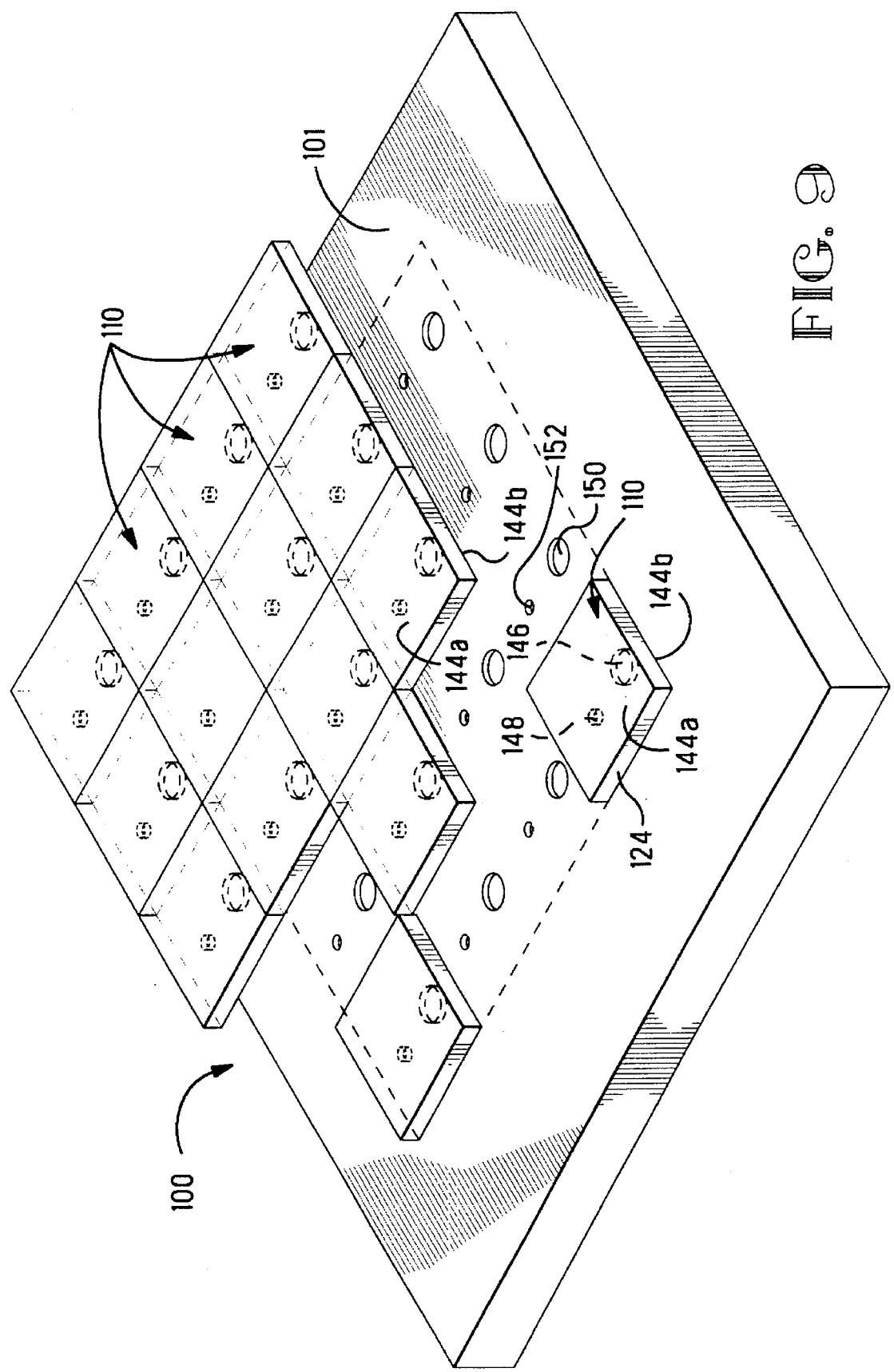

PERIMETER INDEPENDENT PRECISION LOCATING MEMBER

This is a continuation-in-part of U.S. application Ser. No. 08/098,656 filed Jul. 28, 1993 now abandoned.

FIELD OF THE INVENTION

This invention relates to the precise positioning of contact sites for electrical connection; in particular between contact sites of a semiconductor chip and its respective connection members in order to assure electrical connection with the semiconductor chip, or where precision location is necessary to assure electrical contact between devices.

BACKGROUND OF THE INVENTION

Semiconductor chips, or chip(s), provide complex electrical functions in small packages and are fabricated as part of a larger semiconductor wafer. The individual semiconductor chips are separated from the semiconductor wafer by an operation called "dicing" where the chip is cut along what becomes its peripheral edge. The chips are most familiar in electronic applications, such as microprocessors, but may also be useful as electro-optic devices, for example lasers and light emitting diodes.

The semiconductor wafers are processed through conventional techniques of etching, diffusing and doping to produce the desired functions of the individual chips. Each individual chip has a plurality of contact sites exposed along a major surface of the chip that will become engaged by connection members of another electrical article, such as leads or contacts in a socket, to form electrical connections with the chip. The connection members are prepositioned in the article in an arrangement that corresponds to the contact sites of the chip and then the chip must be positioned so that the contact sites and the connection members correspond during its assembly to the article.

If the contact sites are large relative to the connection members, there is sufficient positioning tolerance available so that the peripheral edges of the chip may be utilized to position the chip. One way of doing so is to create a recess that is located relative to the connection members, so that when the chip is within the recess in the article the contact sites align with the connection members. If the periphery of the chip produced during dicing is undersized, the chip may float within the recess. The greater the dimensional discrepancy, the greater the float, possibly enough so that proper electrical connection may not be reliably established.

Another way of aligning the chip within a recess is described in U.S. patent application Ser. No. 08/098,656 filed on Jul. 28, 1993 by Dimitry Grabbe and Iosif Korsunsky. The recess has two adjacent spring sides which bias the chip against opposite sides that are precisely located relative to the connection members. This configuration accommodates variations in the size of the chip while preventing the chip from floating. However, when the periphery of the chip is formed during dicing operation, the edges may still have enough dimensional variation, relative to the contact sites, that the connection members and contact sites may not align accurately enough for reliable electrical engagement.

The smaller contact sites associated with the latest chip configurations require extremely accurate placement of contact sites relative to the connection members to assure that proper electrical connections occur. The use of the periphery of the chip, as established during production dicing operations, is no longer adequate. One way of overcoming this difficulty is through the use of a computer controlled positioning system that uses interactive vision capability to acquire the images of both the contact pads and the leads and, by correlating those images, properly position the contact sites relative to the connection members. Unfortunately, these systems are expensive and relatively slow, thereby making them impractical for production operations where large quantities of chips must be individually positioned relative to a fixed arrangement of connection members.

As semiconductor chips are becoming a more integral component of electronic devices, and with the advent of multi-chip module technology where numerous semiconductor chips are incorporated into a single module, it is critical that the chips be individually burned-in and tested prior to final assembly. By providing "known good die" or tested semiconductor chips for final assembly, the yield of acceptable devices may be substantially increased. Therefore, the chips must be processed through burn-in within test sockets prior to final assembly into a chip carrier, multi-chip module or other device. This requires the chip to be mated with connection members at least twice—once for testing or burn-in and again for final assembly.

To assure efficient placement of the semiconductor chip, what is needed is a simple, economical and practical means for reliably and precisely positioning the contact sites of a semiconductor chip to mating connection members, such as contacts of a burn-in or test socket or any other device that utilizes a bare chip, whereby positioning the chip assures electrical connection.

Liquid crystal displays or other flat displays are used as output devices in a variety of applications ranging from calculators to home appliances to automobiles dash boards. With ever increasing use of these displays comes a desire to make them larger.

Liquid crystal displays are made using a thin film. In thin film, or any photolythographic process, defects due to pin holes or crystal defects are present. While these defects can be reduced, there remains some statistically predictable distribution of defects over relatively large areas of film. Therefore, the larger the film area, the higher the probability of a defect being present. The presence of a film defect is fatal to a display. The result being that some portion of the display, in the area of the defect, will become inactive. A display comprised of an array of small modules results in fewer defects and a higher yield of usable displays. The defect rate in small modules is less than in a larger film because the probability of a defect increases with area as stated above.

These modules must be precisely aligned with adjacent modules in forming the array so that electrical connections can be made between them using techniques such as wire bonding, ion beam deposition, welding or other suitable methods. One way of achieving precise alignment is through the use of a computer controlled positioning system that uses interactive vision capability to acquire the images of contact sites on adjacent modules and by correlating those images, properly positioning the contact sites relative to each other. This is the same method used for positioning a semiconductor chip described above. It has the same limitations in speed and expense as described above for semiconductor chips.

In order to increase the yield rate in production of displays, what is needed is a simple, economical, and practical means for reliably and precisely positioning of adjacent modules to each other or to a burn in test socket whereby positioning the module assures electrical connection.

SUMMARY OF THE INVENTION

The present invention is a perimeter independent precision locating member for a semiconductor chip and a method of making the locating member. The semiconductor chip has contact sites exposed on a major surface thereof that are electrically engageable by connection members, such as contacts or leads, for establishing an electrical connection. The chip also includes a locating member disposed upon the major surface of the semiconductor chip at a specific position relative to the contact sites within the interior region of the major surface of the chip. The locating member is closely matable with a complementary portion of a housing containing the connection members. When the locating member and the complementary portion are mated, the contact sites are aligned and electrically engaged by their corresponding connection members.

The perimeter independent precision locating member can also be applied to a liquid crystal display, a plasma display, or other displays which must be precisely located on a substrate. Modules must be precisely located on a substrate such that they may be electrically interconnected to each other. The modules include the precision locating member on their bottom surfaces and complementary locating members are placed on a substrate. The substrate has an array of complementary locating members such that the modules, when placed over the complementary locating members, form a continuous array which may be used as an output display.

The invention further includes the method of making the perimeter independent precision locating member for a semiconductor chip by the steps of: (a) depositing a layer of material upon the semiconductor chip; (b) determining the location of the contact sites upon the semiconductor chip; (c) curing the portion of the layer deposited upon the semiconductor chip that corresponds to the locating member; and, (d) stripping the uncured portion of the photocurable layer from the semiconductor chip, thereby leaving the cured locating members upon the semiconductor chip in a precise relationship to the contact pads. Afterwhich, the chips having the perimeter independent locating member may be diced from the semiconductor wafer. This method may also be applied to a display module to deposit a precision locating member thereon.

It is an object of this invention to provide an economical and reliable locating member for a semiconductor chip to assure contact sites of the chip are accurately positioned so that the chip may be electrically engaged. It is another object of this invention to provide an economical way of manufacturing the locating member.

It is a feature of this invention that the locating member is disposed on the semiconductor chip within the perimeter of the chip.

It is an advantage of this invention that the locating member is developed independent of the perimeter of the semiconductor chip. It is another advantage of this invention that the locating members of all the chips may be simultaneously developed upon the semiconductor wafer before the chips are cut from the semiconductor wafer. It is still another advantage that the locating member may be formed in an asymmetric shape or off-center to polarize the semiconductor chip, and may comprise two or more locating members asymmetrically located or shaped on each chip.

Other objects, features and advantages of the invention will become apparent upon inspection of the following features and the description of the preferred embodiment.

BRIEF DESCRIPTION OF THE DRAWINGS

An embodiment of the invention will now be described by way of example with reference to the accompanying drawings in which:

FIG. 9 is a partially exploded isometric view of modules above a substrate showing the perimeter independent precision locating members.

DETAILED DESCRIPTION OF PREFERRED EMBODIMENT

Figure 1:
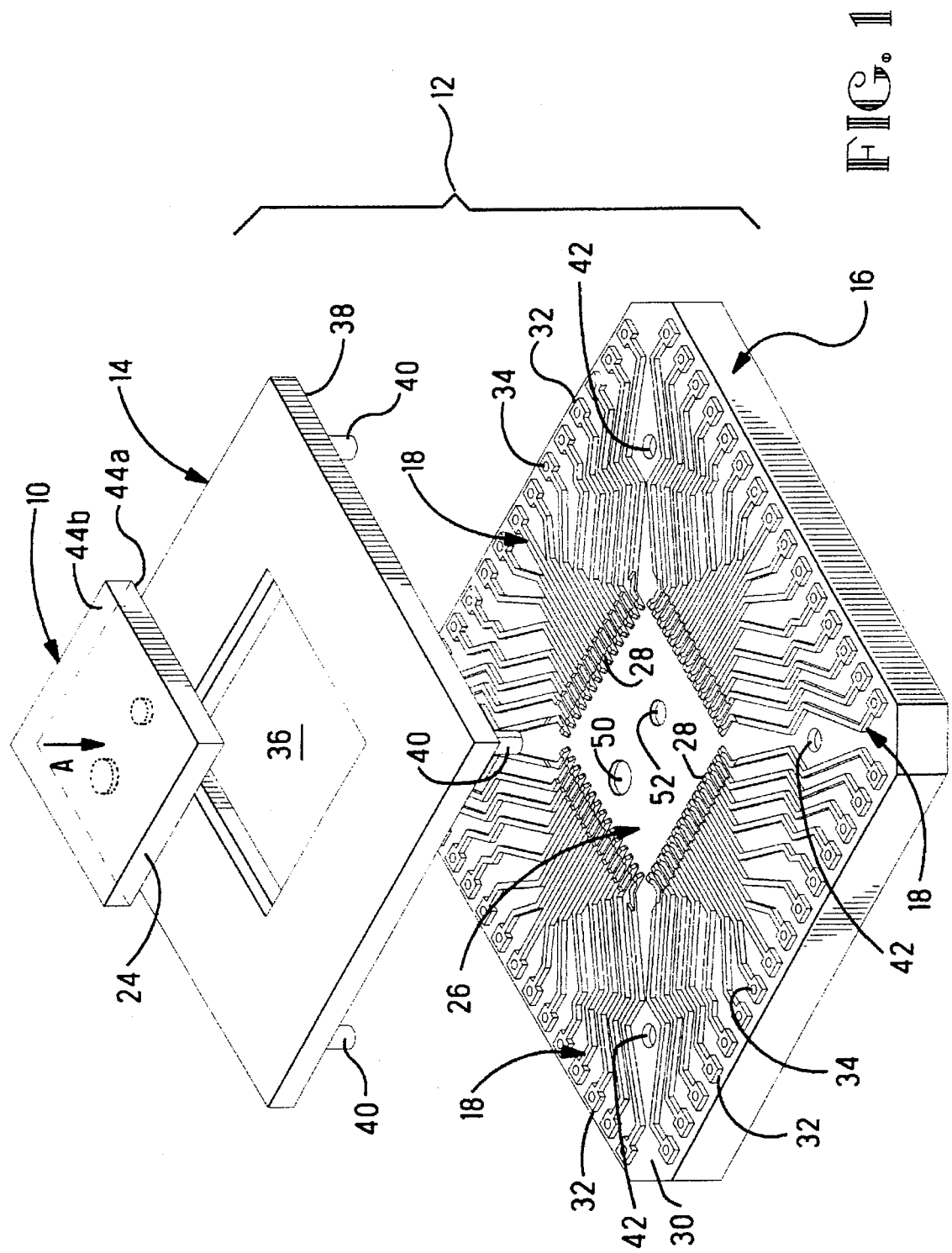
FIG. 1 is a partially exploded isometric view of a semiconductor chip above a two-piece housing that connects the chip to another electrical device.
Figure 2:
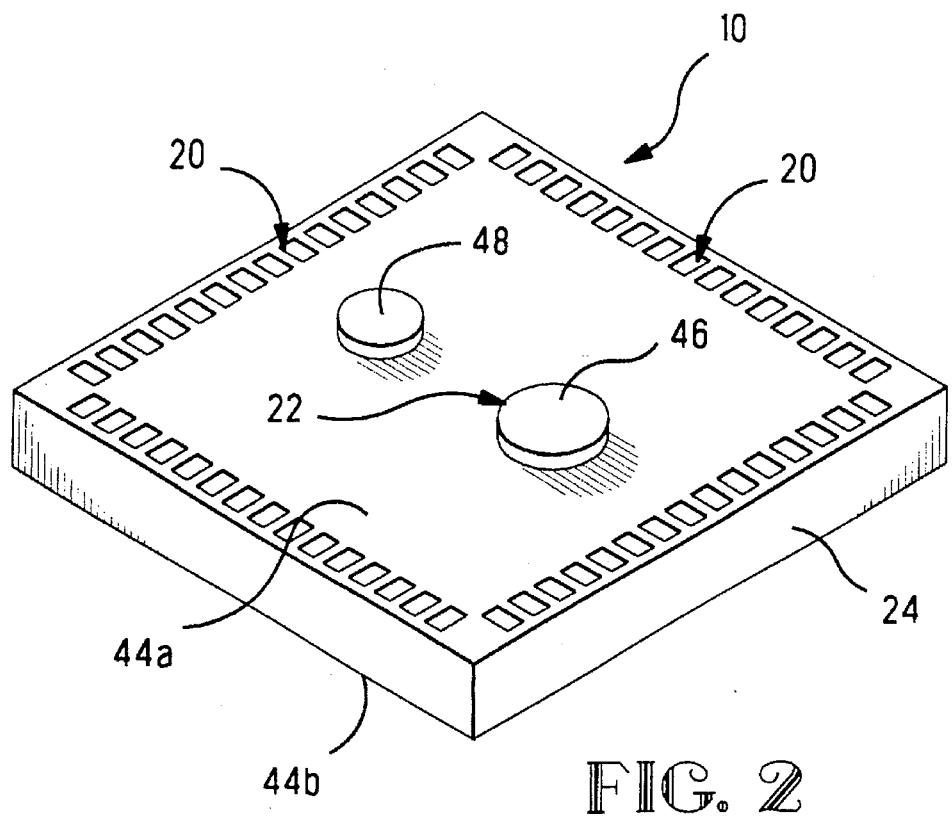
FIG. 2 is an isometric view of the semiconductor chip showing the contact sites and the locating member.

FIG. 1 shows a semiconductor chip (chip) 10, which is representative of an integrated circuit chip although this invention will work with other types of semiconductor chips, and an illustrative housing 12 that could be part of a burn-in or test socket where the chip 10 must be removable. The chip 10 is held in place, and electrical connection is maintained, by a force acting along Arrow A which is generated by conventional means, such as a top plate or clamps (not shown). The housing 12 is constructed from an upper frame 14 and a lower support 16. The housing 12 includes connection members 18 which electrically connect the chip 10 to an electronic device (not shown). The chip 10 has contact sites 20 that enable the chip 10 to be electrically integrated into the electronic device and a locating member 22 that is precisely positioned upon the chip 10 relative the contact sites 20 independently of the perimeter, or peripheral edge, 24 of the chip 10 (FIG. 2). A complementary portion 26 of the housing 12 is precisely positioned relative to the connection members 18 and mates with the locating member 22 to assure that the contact sites 20 correspond to their respective connection members 18 (FIG. 1).

The plurality of connection members 18 are supported in a predetermined arrangement upon the lower support 16 of the housing 12. At one end of each connection member 18 is a contact point 28 that is constructed to electrically engage the semiconductor chip 10 at the contact site 20. The connection members 18 gradually diverge outwardly along the face 30 of the lower support 16 to respective terminals 32. The terminals 32 are spaced apart for easy connection to the electronic device through conventional methods, such as a pin contact (not shown) that would fit into a hole 34 in the terminal 32. The lower support 16 may be the dielectric film that supports the connection members 18 of a lead frame used in a chip carrier assembly.

The upper frame 14 has an opening 36 sized to approximately correspond to the chip 10 so that the chip 10 may be received therein. The underside 38 of the upper frame 14 has positioning pins 40 that fit within bore holes 42 in the face 30 of the lower support 16 to position the opening 36 generally about the contact points 28 of the connection members 18 so that the contact sites 20 of a chip 10 within the opening 36 will be in approximate alignment with their respective contact points 28. The upper frame 14 is not a mandatory component of the housing 12 as its primary use, in reference to this invention, is to provide only general positioning of the chip 10.

When the size of the contact site 20 approaches the size of the connection member contact point 28, it is no longer possible to use the combination of the opening 36 and the perimeter 24 of the chip 10, as established during dicing, for anything more than general positioning. As best seen in FIG. 2, the semiconductor chip 10 would have two opposing first and second major surfaces 44a,44b with the perimeter 24 created during the dicing operation. The contact sites 20 are disposed on one of the first major surface 44a but may be placed on both. Extending outward from the first major surface 44a is the locating member 22, shown in FIG. 2 as a large diameter cylindrical post or boss 46 and a small diameter cylindrical post or boss 48, precisely positioned relative to the contact sites 20.

Within the housing 12 is a complementary portion 26 that is precisely positioned relative the contact points 28 of the connection members 18 (FIG. 1). The complementary portion 26 is a portion of the lower support 16 that contains two cylindrical recesses 50,52 that are sized to closely receive the corresponding cylindrical posts 46,48 upon the chip, thereby assuring the contact sites 20 correspond to the contact points 28 of the connection members 18. The locating member 22 could extend from the second major surface 44b, the surface opposite the one from which the locating member extends in the drawings, and be mated with a part of the housing 12 that would correspond to the second major surface 44b, such as the top plate or clamps that were described above in reference to holding the chip 10 in position. The primary concern is that the complementary portion 26 is precisely positioned relative the contact points 28 of the connection members 18 corresponding to the precise position of the locating member 22 relative the contact sites 20.

The locating member 22 may also be configured to polarize the chip 10 to assure that the symmetrically arranged contact sites 20 correspond with their respective connection members 18. This is accomplished by configuring the locating member 22 so that it is only receivable by the complementary portion 26 when the chip 10 is properly angularly oriented. The large cylindrical post 46 and the small cylindrical post 48 that make up the locating member 22 assure correct polarization because mating with the complementary portion 26 can only occur when the large cylindrical post 46 corresponds to the large cylindrical recess 50. There are numerous other polarization schemes that are dependent upon basic geometry that would also be useful. For example, the shape of the locating member 22 may be at least partially non-symmetrical in and of itself, such as a trapezoid, or a symmetrical shape could be positioned in a non-symmetrical manner upon the chip 10, such as a symmetrical polygon or circle offset from the chip's axis of symmetry of the chip. Perimeter dependent polarization features, such as the removal of a corner of the chip to assure the chip could only be accepted in a particular orientation, are known. As described above, the present invention does not need perimeter dependent features to provide polarization but their use is not excluded because polarization need not be as accurately maintained as positioning.

Figure 3:
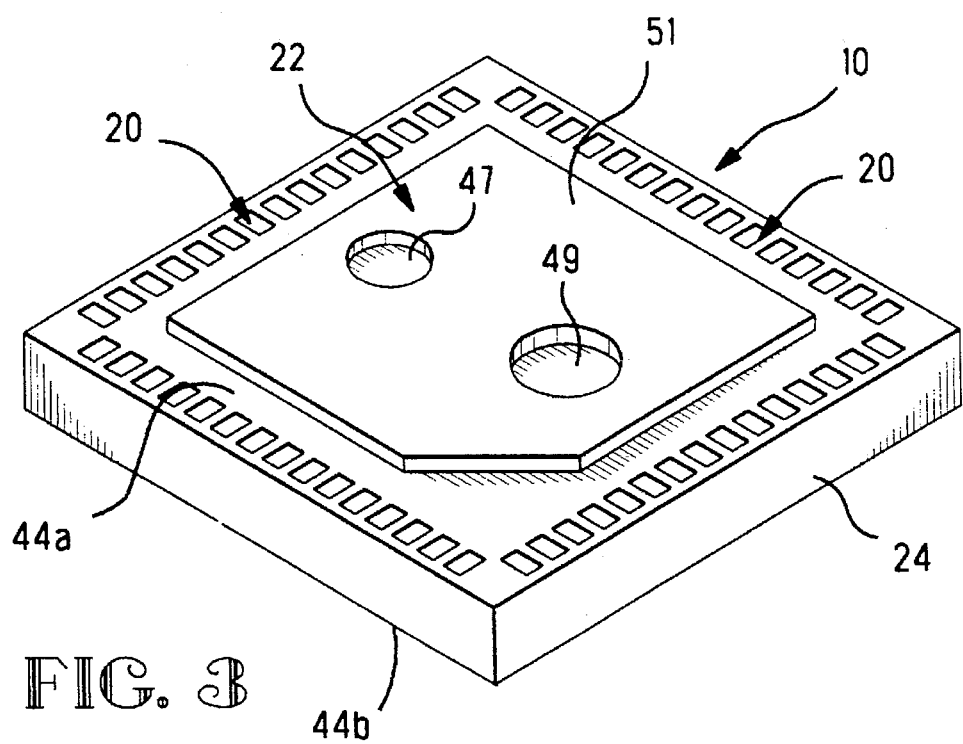
FIG. 3 is an isometric view of an alternative embodiment of the locating member upon the semiconductor chip.

An alternative embodiment shown in FIG. 3 has the locating member 22 developed by forming indentations 47,49 in an additive layer 51 disposed upon one of the first or second major surfaces 44a,44b of the chip 10. The complementary portion 26 would then be projections from the housing 12, rather than the recesses 50,52 that are described above, to closely mate with the indentations in the additive layer. The additive layer 51 could also be formed into an asymmetrical shape, such as the polygon in FIG. 3, that would be used to locate and orient the chip 10. These configurations have the advantage of providing a larger pad on the chip which would provide a stronger bond to the major surface.

Figure 4A:
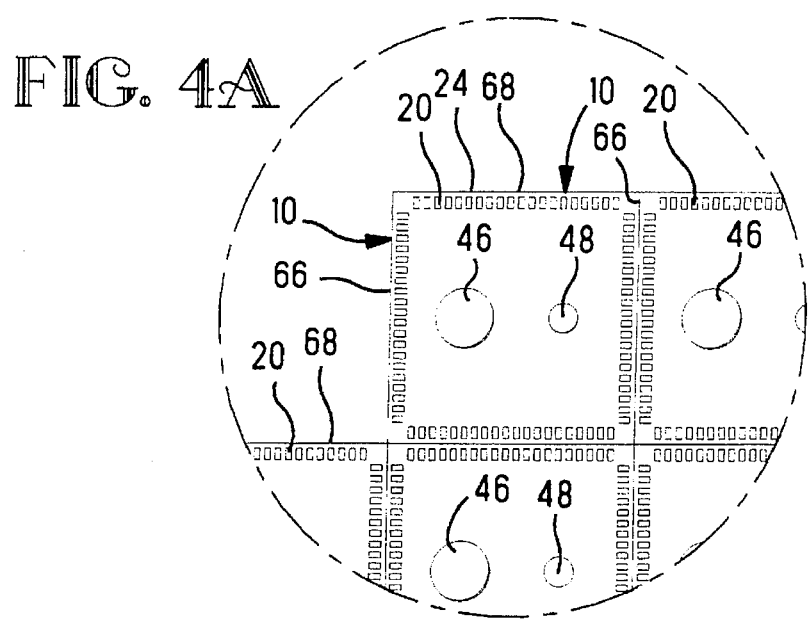
FIGS. 4 and 4A are top views of a semiconductor wafer showing individual semiconductor chips prior to dicing.
Figure 4:
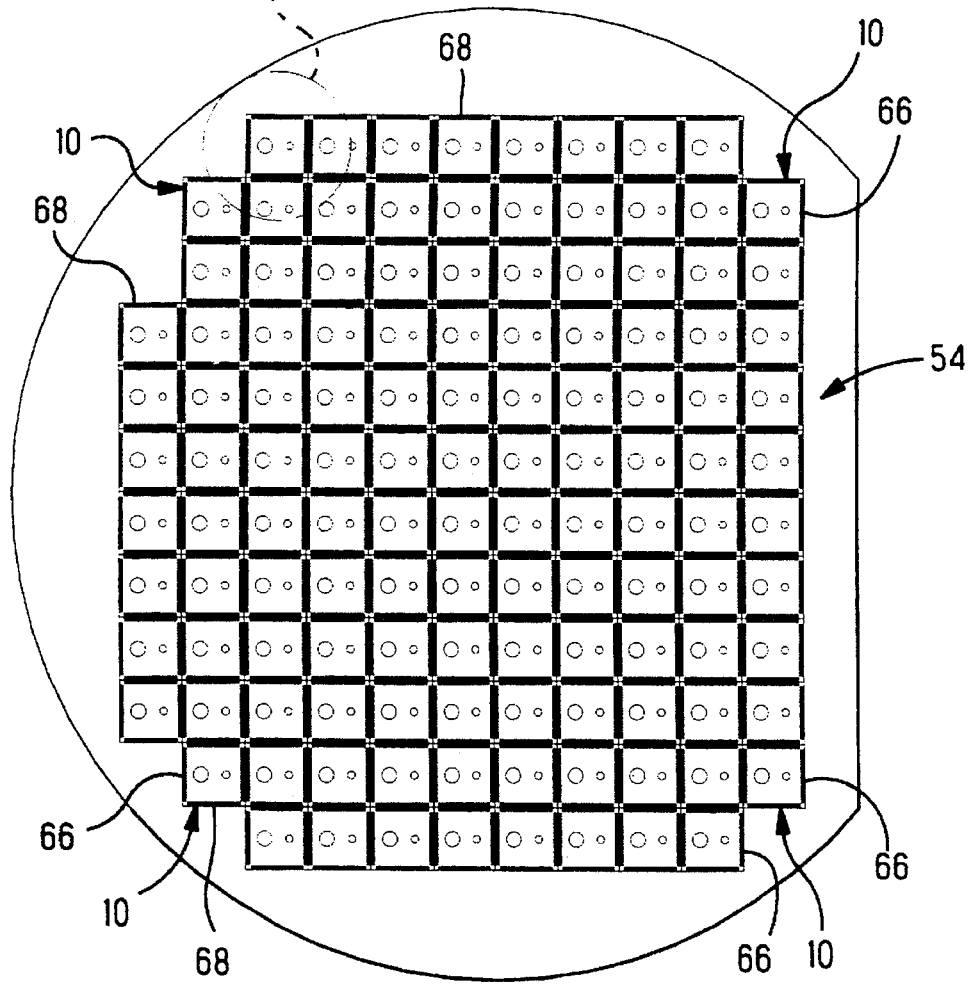

Individual semiconductor chips 10 are constructed from larger semiconductor wafers 54 (FIG. 4) through conventional techniques. As shown in FIGS. 4 and 4a, it is possible to produce a number of individual semiconductor chips 10 from a single wafer 54. As used herein, semiconductor chips 10 include integrated circuits, semiconductor lasers, light emitting diodes and any other semiconductor device that has features incorporated during the processing of the semiconductor chip 10 that must be accurately aligned to an externally positioned components.

Figure 5:
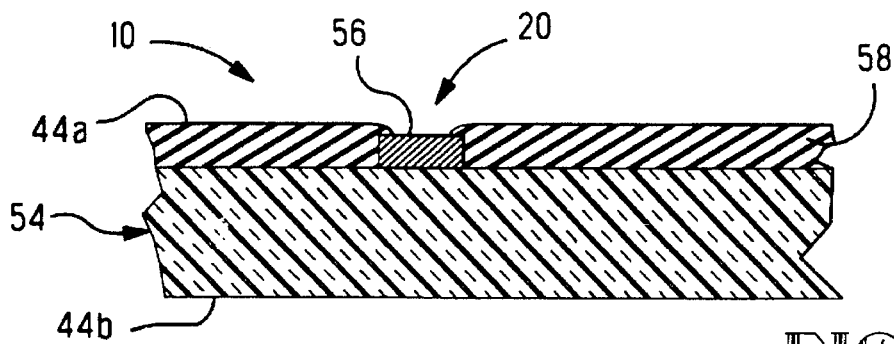
FIG. 5 is a cross-sectional view of the semiconductor chip including a passivation layer.

As the wafer 54 is being processed, conductive pads 56, typically 4 mils by 4 mils ($1 \text{ mil}=1\times10^{-3}$ inches) in size, are deposited upon the wafer 54 in the locations required to establish electrical connection with each of the respective chips 10 being created. The wafer 54 is coated with a passivation layer 58 that protects the processed chip 10 by growing silicon dioxide thereupon or by the deposition of a glass on the wafer 54 (FIG. 5). The passivation layer 58 is chemically etched through at the location of each of the conductive pads 56 to create the contact site 20. The contact site 20 presents an approximately 2 mil by 2 mil window in the passivation layer 58 for the contact points 28 of the connection members 18 to be exposed for electrical engagement in order to establish electrical connection with the semiconductor chip 10.

Figure 6:
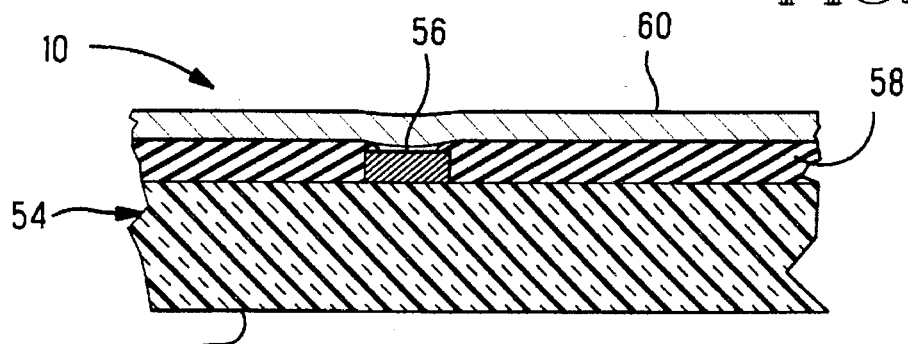
FIG. 6 is a cross-sectional view of the semiconductor chip of FIG. 5 with a layer of photocurable material thereupon.

Once the passivation layer 58 has been formed, a photocurable material 60 is placed upon the wafer 54 (FIG. 6). This photocurable material 60 may be the same as what is used as a solder mask in processing printed circuits and typically takes on the form of a thin sheet. One example of this photocurable material is RISTON, a product of E. I. Dupont of Wilmington, Del., which is cross-links upon exposure to ultra-violet light. This material may be hot-rolled upon the semiconductor chip.

Figure 7:
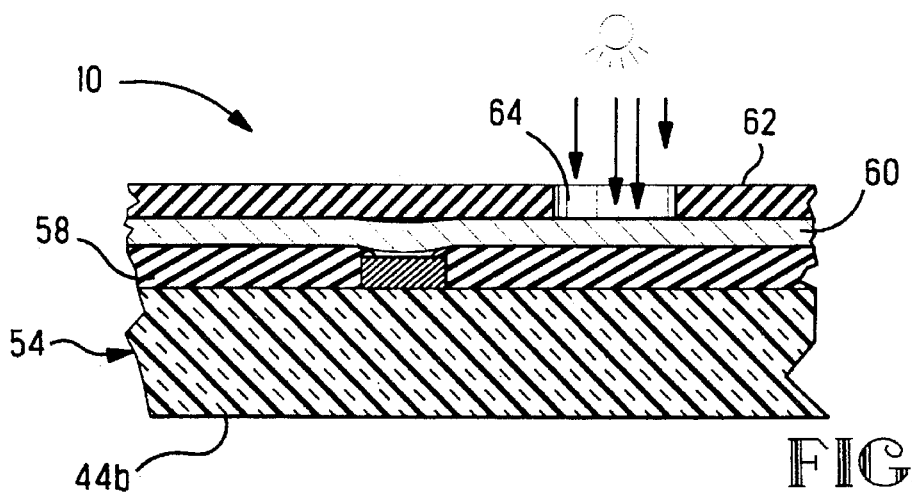
FIG. 7 is a cross-sectional view of an illuminated semiconductor chip of FIG. 6 with a mask in place.

A mask 62 that is preformed to have openings 64 that correspond to the shape of locating members 22, is positioned upon the photocurable material 60 upon the semiconductor wafer 54 in a predetermined orientation to the contact sites 20 and is precisely positioned with reference thereto (FIG. 7). Mask 62 is optically opaque to light of the wavelengths to which the photocurable material is sensitive. The mask 62 is positioned upon the wafer through conventional positioning techniques used in the processing of semiconductor wafers. In this embodiment, the openings 64 would be circular and sized to correspond to the large diameter post 46 and the small diameter post 48 that form the locating member 22. Other shapes may easily be formed in the mask if desired.

Figure 8:
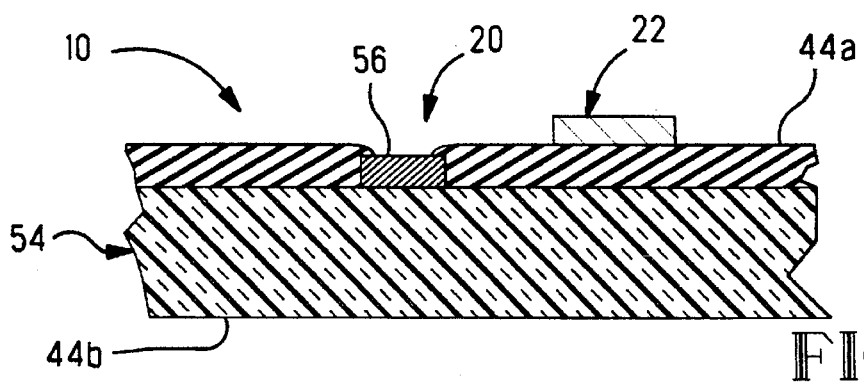
FIG. 8 is a cross-sectional view of the semiconductor chip of FIG. 5 with a locating member formed thereupon.

The photocurable material 60 is exposed through the openings 64 in the mask 62. The exposed portion is illuminated with light having a wavelength that cures the photocurable material 60 in the form of the locating member 22. The mask 62 is then removed and the portions of the photocurable material 60 that were not subjected to illumination, because the mask blocked the light, are washed from the wafer 54 by conventional developing wash solvents leaving behind the now-cured locating members 22 (FIG. 8).

The locating members 22 that remain upon the semiconductor chip 10 are precisely located relative the contact sites 20 due to the precise positioning of the mask 62 upon the wafer 54.

Once the locating members 22 have been formed upon the semiconductor chips 10 of the semiconductor wafer 54, the wafer 54 may be diced into the individual semiconductor chips 10. The dicing no longer has to be as precise as any deviation from the optimum cutting path, shown as horizontal lines 66 and vertical lines 68 in FIG. 4, no longer effect the positioning of the contact sites 20. The semiconductor chip 10 is located by perimeter independent means that are precisely related to the contact sites 20 of the chip 10.

The present invention may be applied to any object or device made of a material which will accept the deposition of photocurable material through, for example, the photolythographic process described above. Any such object which must be precisely located onto another object may include this locating member. For example, in forming an LED display 100, as shown in FIG. 9, many modules 110 may be interconnected in an array. The back side or passive side 144b of each module 110 can be modified photolythographically in the same process steps as the integrated circuit chip case described above. Note that FIGS. 5–8 show deposition of the locating member 22 onto the active side of, for example, a semiconductor chip 54 or other device. However, as shown on FIG. 9, the locating member may also be deposited, using the same process, onto a passive side 144b of a device or module 110. A larger substrate 101 may then processed with a correct placement, checkerboard style of corresponding features, so as to achieve a simple mechanical placement of the modules 110 onto such substrates 101, with correct registration or alignment of contact sites (not shown) and display lines (not shown) on adjacent modules 110. Contact sites are typically disposed on either the top or active side 144a, or the bottom or passive side 144b, along the edges thereof. This method not only allows for the manufacturing simplification, but also for repair, since modules 110 can be removed and reattached without losing their accurate relationship to each other.

It should be recognized that the above-described embodiments and forms constitute the presently preferred form of the invention and that the invention may take numerous other forms, only some of which have been described above. Accordingly, the invention should be only limited by the scope of the following claims.

I claim:

1. A semiconductor chip having major surfaces and contact sites for establishing an electrical connection therewith, the semiconductor chip being receivable upon a housing having connection members correspondingly arranged to at least some of the contact sites, so that when the semiconductor chip is received on the housing the connection members electrically engage their respective contact sites; wherein the improvement comprises:

the contact sites located on one of the major surfaces, a locating member, formed of a deposited material, disposed upon the semiconductor chip on one of the major surfaces thereof and within a perimeter of the semiconductor chip and at a specific position relative the contact sites, the locating member being matable with a complementary member of the housing such that when so mated, the contact sites are aligned with their corresponding connection members.

2. The semiconductor chip of claim 1, wherein the locating member has a polarizing configuration, whereby the locating member may only be mated to the complementary portion when the chip is particularly oriented so that respective contact sites and connection members are in a corresponding relationship.

3. The semiconductor chip of claim 1, wherein the locating member is a pair of cylindrical bosses having different diameters.

4. The semiconductor chip of claim 1, wherein the locating member comprises photocured material upon the semiconductor chip.

5. A semiconductor chip positioning system, comprising:

a semiconductor chip having opposing major surfaces; contact sites located on one of the major surfaces for establishing an electrical connection to the semiconductor chip; and at least one locating member, formed of a deposited material, disposed upon one of the major surfaces within a perimeter of the chip in precise and known relationship to the contact sites; and a housing having connection members with contact points formed to engage the contact sites of the semiconductor chip and arranged upon the housing to correspond with the contact sites of the semiconductor chip and a complementary portion positioned in a precise relation to the contact points of the connection members and configured to closely mate with the locating member, whereby when the semiconductor chip is placed onto the housing, the locating member is mated with the complementary portion so that the contact points of the connection members electrically engage the contact sites of the semiconductor chip.

6. The semiconductor chip positioning system of claim 5, wherein the locating member upon the semiconductor chip is a pair of different diameter cylindrical embossments extending from the major surface and the complementary portion of the housing is a corresponding pair of different diameter recesses in the housing.

7. The semiconductor chip positioning system of claim 5, wherein the locating member is non-symmetrical, whereby the semiconductor chip is polarized.

8. The semiconductor chip positioning system of claim 5, wherein the locating material comprises cured photocurable material.

9. The semiconductor chip positioning system of claim 5, wherein the housing has a lower support upon which the connection members are arranged and an upper frame attached to the lower frame having an opening that receives the semiconductor chip, the opening positioned generally about the feet of the connection members, thereby providing general positioning of the chip.

10. A semiconductor chip having major surfaces and contact sites for establishing an electrical connection therewith, the semiconductor chip being receivable upon a housing having connection members correspondingly arranged to at least some of the contact sites, so that when the semiconductor chip is received on the housing the connection members electrically engage their respective contact sites; wherein the improvement comprises:

the contact sites located on one of the major surfaces, a locating member, formed of a deposited photocurable material, disposed upon the semiconductor chip on one of the major surfaces thereof and within a perimeter of the semiconductor chip and at a specific position relative the contact sites, the locating member being matable with a complementary member of the housing such that when so mated, the contact sites are aligned with their corresponding connection members.

11. A semiconductor chip positioning system, comprising:

a semiconductor chip having opposing major surfaces; contact sites located on one of the major surfaces for establishing an electrical connection to the semiconductor chip; and at least one locating member, formed of a deposited photocurable material, disposed upon one of the major surfaces within a perimeter of the chip in precise and known relationship to the contact sites; and a housing having connection members with contact points formed to engage the contact sites of the semiconductor chip and arranged upon the housing to correspond with the contact sites of the semiconductor chip and a complementary portion positioned in a precise relation to the contact points of the connection members and configured to closely mate with the locating member, whereby when the semiconductor chip is placed onto the housing, the locating member is mated with the complementary portion so that the contact points of the connection members electrically engage the contact sites of the semiconductor chip.

12. A device having major surfaces and contact sites for establishing electrical connection therewith, the device being receivable upon a substrate so that when the device is received on the substrate, connection members are aligned to electrically engage connection members of an adjacent device, contact sites being located on one of the surfaces, a locating member formed of a deposited material disposed upon the device on one of the major surfaces thereof and within a perimeter of the device and at a specific position relative to the contact sites, the locating member being matable with a complementary member on the substrate that when so mated, the contact sites are aligned with corresponding contact sites on adjacent devices.

13. The device of claim 12, wherein the locating member has a polarizing configuration, whereby the locating member may only be mated to the complementary member when the chip is particularly oriented so that respective contact sites are in a corresponding relationship.

14. The device of claim 12, wherein the locating member is a pair of cylindrical bosses having different diameters.

15. The device of claim 12, wherein the locating member comprises photocured material upon the device.

16. The device of claim 12 wherein the major surfaces comprise a passive side and an active side.

17. The device of claim 16, wherein the major surfaces comprise a passive side and an active side.

18. A device positioning system comprising:

a device having opposing major surfaces and pairs of opposing minor surfaces, contact sites located on at least one of the surfaces for establishing an electrical connection to the device, and at least one locating member, formed of a deposited material, disposed upon one of the major surfaces within a perimeter of the device in precise and known relationship to the contact sites, and a substrate having complementary locating members to engage the locating members of the device arranged in an array on the substrate to position an array of devices such that their contact sites are in precise relationship to each other, whereby when the device is placed onto the substrate, the locating members are mated with the complementary portions on the substrate so that the contact points of adjacent devices are in precise alignment with each other for electrical connection therebetween.

19. The device positioning system of claim 18, wherein the locating member upon the device is a pair of different diameter cylindrical posts extending from the major surface and the complementary portion of the substrate is a pair of corresponding recesses in the substrate.

20. The device positioning system of claim 18, wherein the locating member is non-symmetrical, whereby the device is polarized.

21. The device positioning system of claim 18, wherein the deposited material comprises cured photocurable material.

* * * * *